United States Patent
Nishimura

(10) Patent No.: US 6,222,609 B1
(45) Date of Patent: *Apr. 24, 2001

(54) REDUCTION PROJECTION ALIGNER FREE FROM REACTION PRODUCT TARNISHING PHOTO-MASK AND METHOD FOR TRANSFERRING PATTERN IMAGE THROUGH THE PHOTO-MASK

(75) Inventor: Yoji Nishimura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/967,046

(22) Filed: Nov. 10, 1997

(30) Foreign Application Priority Data

Nov. 12, 1996 (JP) .................................................. 8-299175

(51) Int. Cl.⁷ .............................. G03B 27/52; G03B 27/54
(52) U.S. Cl. .................................................. 355/30; 355/67
(58) Field of Search .................................. 355/30, 43, 44, 355/53, 67, 77; 250/289, 492.2, 492.22; 356/399–401

(56) References Cited

U.S. PATENT DOCUMENTS

| 4,766,309 | * | 8/1988 | Kudo | 250/237 |
|---|---|---|---|---|
| 4,786,947 | * | 11/1988 | Kosugi et al. | 355/30 |
| 4,937,618 | * | 6/1990 | Ayata et al. | 355/53 |
| 5,025,284 | * | 6/1991 | Komoriya et al. | 355/53 |
| 5,153,441 | * | 10/1992 | Moriizumi | 250/492.2 |
| 5,172,403 | * | 12/1992 | Tanaka et al. | 378/34 |
| 5,337,097 | * | 8/1994 | Suzuki et al. | 353/101 |
| 5,533,083 | * | 7/1996 | Nagai et al. | 378/44 |
| 5,568,978 | * | 10/1996 | Johnson et al. | 374/161 |
| 5,748,288 | * | 5/1998 | Nagano et al. | 355/53 |
| 5,784,150 | * | 7/1998 | Itoh | 355/53 |

FOREIGN PATENT DOCUMENTS

| 62-86724 | 4/1987 | (JP) . |
|---|---|---|
| 63-90129 | 4/1988 | (JP) . |
| 2-98918 | 4/1990 | (JP) . |
| 2-153518 | 6/1990 | (JP) . |
| 3-127814 | 5/1991 | (JP) . |

* cited by examiner

Primary Examiner—Russell Adams
Assistant Examiner—Hung Henry Nguyen
(74) Attorney, Agent, or Firm—Sughrue, Mion, Zinn, Macpeak & Seas, PLLC

(57) ABSTRACT

A reduction projection aligner has a light source accommodated in an air-tight vessel, an optical filter fitted in the air-tight vessel, a reticle provided outside of the air-tight vessel and a reduction projection lens unit provided between the reticle and a photo-sensitive layer, and an evacuating system creates vacuum in the air tight vessel so that undesirable short-wavelength light component, which promotes undesirable reaction for tarnishing the reticle, is eliminated from the light before radiation from the air-tight vessel.

5 Claims, 4 Drawing Sheets

REDUCTION PROJECTION ALIGNER FREE FROM REACTION PRODUCT TARNISHING PHOTO-MASK AND METHOD FOR TRANSFERRING PATTERN IMAGE THROUGH THE PHOTO-MASK

FIELD OF THE INVENTION

This invention relates to an optical aligner and, more particularly, to an optical aligner free from reaction product tarnishing photo-mask and a method for transferring a pattern image through the photo-mask.

DESCRIPTION OF THE RELATED ART

A typical example of the reduction projection aligner is disclosed in Japanese Patent Publication of Unexamined Application No. 62-86724. An air evacuating system is incorporated in the prior art reduction projection aligner for reducing undesirable particles in the wafer chamber. FIG. 1 illustrates the prior art reduction projection aligner. The reduction projection aligner comprises a light source 1, a vessel 2 defining a vacuum chamber 2a, a vacuum pump 3 connected to the vacuum chamber 2a, a movable wafer stage 4 provided outside of the vessel 2 and exposure windows 5a/5b formed in the vessel 2 on the optical path from the light source 1 to the movable wafer stage 4. A semiconductor wafer 6 is placed on the movable wafer stage 4, and the movable wafer stage 4 two-dimensionally moves the semiconductor wafer 6. The light source 1 is implemented by an ultra high-pressure mercury lamp, and radiates ultra-violet light through the exposure window 5a. The vacuum pump 3 evacuates the air from the vacuum chamber 2a.

The prior art reduction projection aligner further comprises a movable reticle stage 7 installed in the vacuum chamber 2a, a reticle loader 8 provided under the exposure window 5a, a reduction projection lens unit 10 provided between the movable reticle stage 7 and the exposure window 5b and an inspection unit 11 also provided in the vacuum chamber 2a. The reticle loader 8 picks up a reticle 9 at a loading port (not shown), and moves it onto the movable reticle stage 7. A pattern to be transferred is formed in the reticle 9. The ultra-violet light passes the exposure window 5a, the reticle 9, the reduction projection lens unit 10 and the exposure window 5b, and transfers the pattern image onto the semiconductor wafer 6, and the reduction projection lens unit 10 demagnifies the pattern image. The inspection unit 11 checks the reticle 9 to see whether or not the reticle is contaminated with dust particles.

The pattern is repeatedly transferred from the reticle 9 from the semiconductor wafer 6 as follows. First, an operator supplies the reticle 9 to the loading port, and the inspection unit 11 checks the reticle 9 to see whether or not the reticle,9 is contaminated with dust particles. If the dust particles are not found, the reticle loader 8 transfers the reticle 9 onto the movable reticle stage 7. The vacuum pump 3 evacuates the air from the vacuum chamber 2a together with dust particles. For this reason, the reticle 9 is hardly contaminated in the vacuum chamber 2a. The movable wafer stage 4 moves the semiconductor wafer 6 in such a manner as to align a small area on the semiconductor wafer with the optical path 12 of the ultra violet light.

The light source 1 radiates the ultra-violet light toward the exposure window 5a. The ultra-violet light passes the exposure window 5a and the reticle 9, and carries the pattern image. The image-carrying ultra-violet light passes through the reduction projection lens unit 10, and the pattern image is reduced by the reduction projection lens unit 10. The image-carrying ultra-violet light falls onto the small area, and forms a latent image therein. The movable wafer stage 4 aligns another small area with the optical path, and the optical image transfer is repeated. In this way, the pattern is optically transferred from the reticle to the semiconductor wafer, and the inspection unit 11 and the vacuum pump 3 prevent the semiconductor wafer 6 from undesirable defects due to the dust particles.

A known modification of the prior art reduction projection aligner has the reticle and the movable wafer stage installed in the vertical direction, and a pattern image is transferred from the vertical reticle to a semiconductor wafer vertically supported by the movable wafer stage. In this instance, the possibility of the dust contamination is further decreased. However, the prior art reduction projection aligner encounters a problem in that the exposure windows 5a/5b are tarnished. The tarnished exposure windows 5a/5b deteriorate the uniformity of the ultra-violet light, and decrease the throughput.

SUMMARY OF THE INVENTION

It is therefore an important object of the present invention to provide an aligner, which maintains the uniformity of light radiated through exposure windows.

The present inventor analyzed the contaminant on the exposure windows, and found that the contaminant was reaction product unintentionally produced from gaseous component of the air in the presence of short-wavelength light components contained in the ultra-violet light. The reaction product tarnished the exposure windows. The ultra high-pressure mercury lamp contained the short-wavelength light. The present inventor changed the light source from the ultra high-pressure mercury lamp to another kind of lamp. However, the reaction product was produced from the certain gaseous component in so far as the exposure light contained the certain short-wavelength light components, and the reaction product tarnished the exposure windows. The present inventor concluded that the undesirable short-wavelength light components had to be eliminated from the light before the reaction. Alternatively, when the optical path from the light source to the photo-mask was in vacuum, the reaction product was not produced without the filtering.

To accomplish the object, the present invention proposes to cause light to pass an optical filter before radiating into the air or accommodate the light path from a light source to a photo-mask in vacuum.

In accordance with one aspect of the present invention, there is provided an optical aligner for transferring a pattern image to a photo-sensitive layer, comprising: an illumination system including a light source producing light containing a light component available for a pattern transfer and another light component promoting reaction of a gaseous component; a photo-mask having a pattern to be transferred, and illuminated with the light; an projection optical system provided between the photo-mask and the photo-sensitive layer for forming a latent image in the photo-sensitive layer; an air-tight vessel accommodating at least a part of the illumination system containing the light source; an optical filter for eliminating the another light component from the light before the light is radiated from the air tight vessel toward the photo-mask; and an evacuating system for creating vacuum in the air-tight vessel.

In accordance with another aspect of the present invention, there is provided an optical aligner for transferring a pattern image to a photo-sensitive layer, comprising: an illumination system including a light source producing light containing a light component available for a pattern transfer and another light component promoting reaction of a gaseous component; a photo-mask having a pattern to be transferred, and illuminated with the light; an projection optical system provided between the photo-mask and the photo-sensitive layer for forming a latent image in the photo-sensitive layer; an air-tight vessel accommodating at least the light source and the photo-mask; and an evacuating system for creating vacuum in the air-tight vessel.

In accordance with yet another aspect of the present invention, there is provided a method for transferring a pattern image from a photo-mask to a photo-sensitive layer, comprising the steps of: a) providing the photo-mask in an optical path from a light source to the photo-sensitive layer; b) evacuating the air from a vacuum chamber accommodating the light source; and c) radiating light from the light source through an optical filter provided on a boundary between the vacuum chamber and the photo-mask to the photo-sensitive layer so as to eliminate a light component promoting a reaction of a gaseous component from the light, thereby forming a latent image in the photo-sensitive layer.

In accordance with still another aspect of the present invention, there is provided a method for transferring a pattern image from a photo-mask to a photo-sensitive layer, comprising the steps of: a) providing the photo-mask in a vacuum chamber together with an illuminating system and a projection optical system; b) evacuating the air from the vacuum chamber; and c) radiating light from the illuminating system through the photo-mask and the projection optical system to the photo-sensitive layer so as to form a latent image in the photo-sensitive layer.

BRIEF DESCRIPTION OF THE DRAWINGS

The features and advantages of the aligner and the method for transferring a pattern will be more clearly understood from the following description taken in conjunction with the accompanying drawings in which.

DESCRIPTION OF THE PREFERRED EMBODIMENTS

First Embodiment

Figure 1:
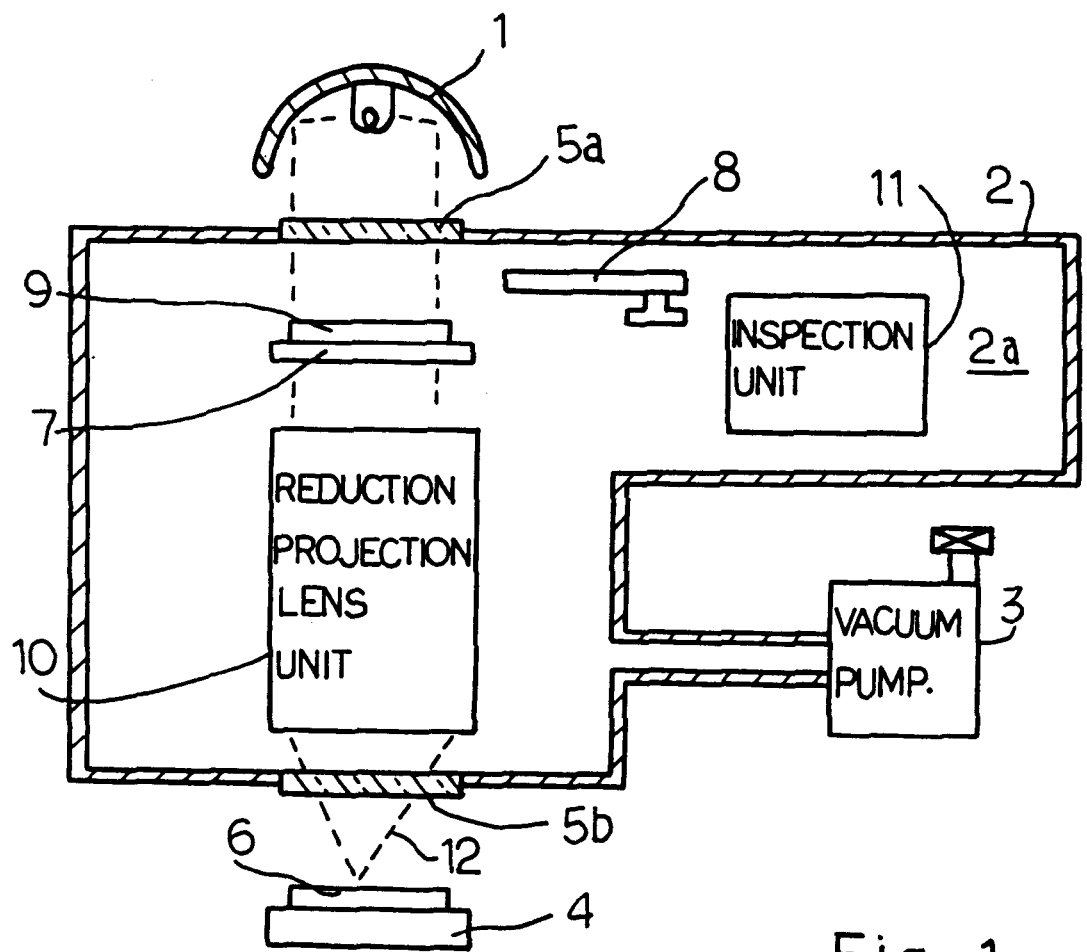
FIG. 1 is a schematic view showing the structure of the prior art reduction projection aligner.
Figure 2:
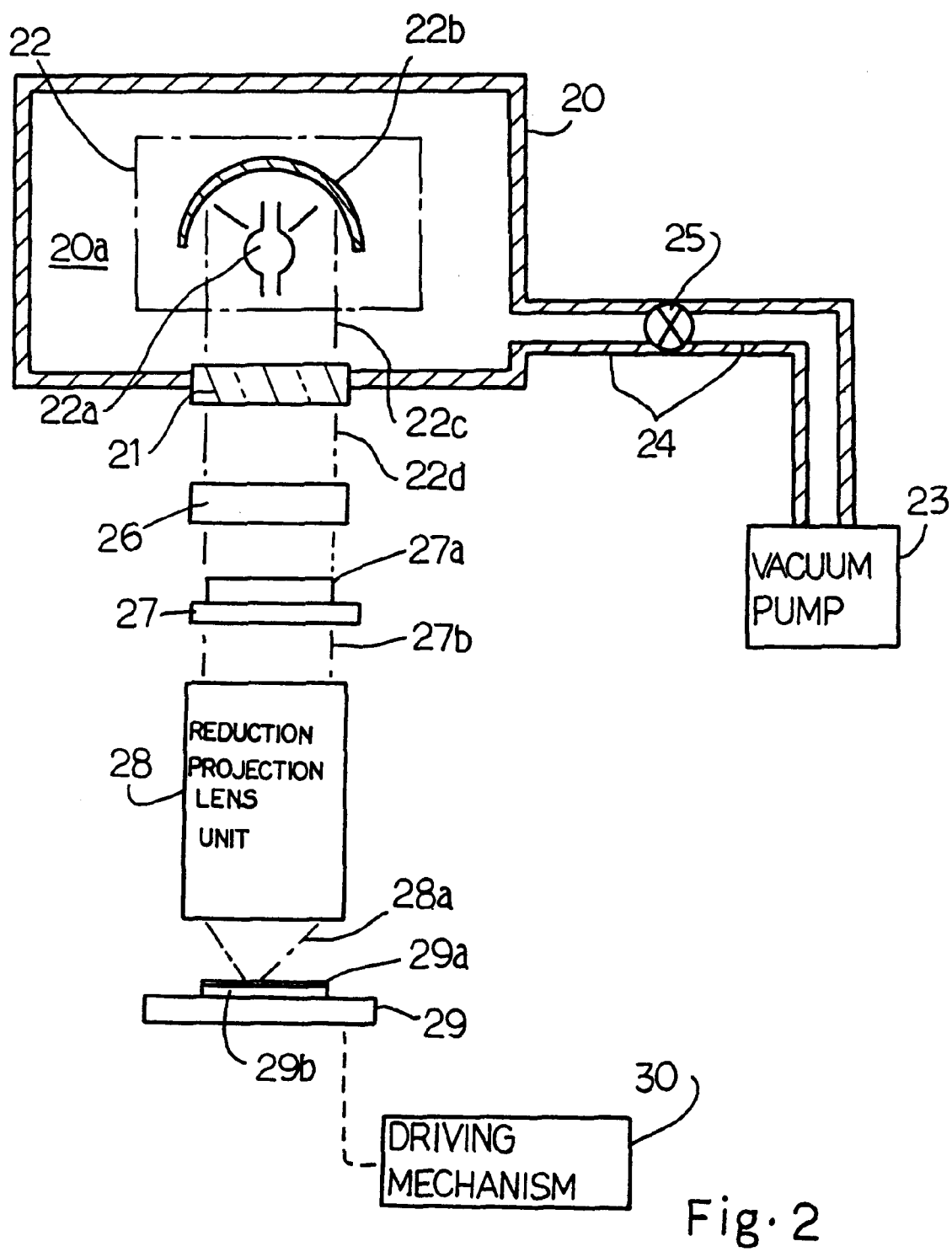
FIG. 2 is a schematic view showing the structure of a reduction projection aligner according to the present invention.

Referring to FIG. 2 of the drawings, a reduction projection aligner embodying the present invention comprises a vessel 20 defining a vacuum chamber 20a, a filter plate 21 fitted in the vessel 20, a light source 22 accommodated in the vessel 20, a vacuum pump 23 connected to the vacuum chamber through a gas conduit 24 and a valve unit 25 inserted into the gas conduit 24. An ultra high-pressure mercury lamp 22a and elliptical reflection mirror 22b form in combination the light source 22. The ultra high-pressure mercury lamp 22a radiates ultra-violet light 22c, and the elliptical reflection mirror 22b directs the ultra-violet light 22c toward the filter plate 21. The vacuum pump 23 creates vacuum in the chamber 20a, and the vacuum is less than 1 torr to $10^{-2}$ torr. Undesirable gaseous component are too tight in the vacuum chamber 20a to produce the reaction product such as $(NH_4)_2SO_4$ and $SiO_2$. When the chamber 20a reaches the vacuum at less than 1 torr to $10^{-2}$ torr, the vacuum pump 23 is stopped, and the valve unit 25 cut off the connection between the vacuum chamber 20a and the vacuum pump 23. The valve unit 25 maintains the vacuum in the chamber 20a. The vacuum pump 23 may be implemented by a dry pump or a clean pump.

The filter plate 21 serves as an interference filter, which allows only a certain wavelength light component used for a pattern transfer to pass there-through. The undesirable short-wavelength light components have the wave-length 340 nanometers or less. For this reason, the filter plate 21 allows the light component used for the pattern transfer to pass therethrough, and eliminates the light components equal to or less than 340 nanometer wavelength from the ultra-violet light 22c. Thus, the exposure light 22d does not contain the undesirable short-wavelength light components.

The reduction projection aligner further comprises a condenser lens 26, a reticle holder 27, a reduction projection lens unit 28, a wafer stage 29 two-dimensionally movable and a driving mechanism 30 connected to the wafer stage 29. A reticle 27a is mounted on the reticle holder 27, and a pattern to be transferred is formed in the reticle 27a. A reticle loader (not shown) may supply the reticle 27a onto the reticle holder 27. The condenser lens 26 causes the reticle 27a to form the pattern image on the incident surface of the reduction projection lens unit 28. The reduction projection lens unit reduces the pattern image, and the reduced pattern image is focused on a photo-sensitive layer 29a over a semiconductor wafer 29b. Reference numeral 28a designates a reduced image carrying light from the reduction projection lens unit 28 to the photo-sensitive layer 29a.

The pattern image is transferred from the reticle to the photo-sensitive layer 29a as follows. First, the reticle 27a is placed on the reticle holder 27, and the semiconductor wafer 29b is mounted on the wafer stage 29. The driving mechanism 30 aligns a small area of the photo-sensitive layer 29a with the optical path of the reduced image carrying light 28a. The vacuum pump 23 creates the vacuum in the chamber 20a, and the ultra high-pressure mercury lamp starts to radiate the ultra-violet light. The elliptical reflecting mirror 22b directs the ultra-violet light toward the filter plate 21. The ultra-violet light 22c is propagated through the vacuum chamber 20a, and passes through the filter plate 21. Even though the ultra-violet light 22c contains the undesirable short-wavelength light components, the reaction product is never produced in the chamber 20a, because the air has been evacuated from the chamber 20a.

The filter plate 21 eliminates the undesirable short-wavelength light components from the ultra-violet light 22c, and only the light component available for the pattern transfer is radiated from the filter plate 21 to the condenser lens 26 as the exposure light 22d. The exposure light 22d passes through the reticle 27a, and carries the pattern image to be transferred. The image-carrying exposure light 27b is incident onto the reduction projection lens unit 28, and the reduction projection lens unit 28 focuses the reduced image-carrying light 28a on the small area of the photo-sensitive layer 29a.

In this instance, the light source 22, the condenser lens 26 as a whole constitute an illumination system, and the reduction projection lens unit 28 serves as a projection optical system.

Figure 4:
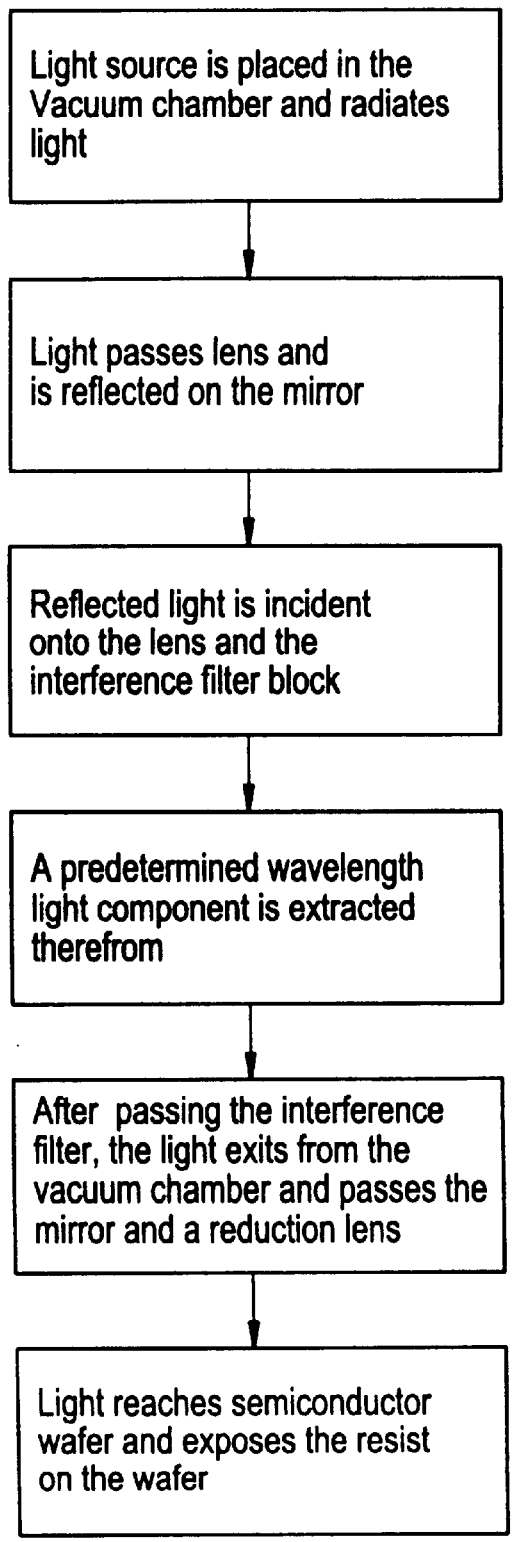
FIG. 4 is a detailed flow chart of a transferring pattern image according to an embodiment of the invention.

As will be appreciated from the foregoing description, while the ultra-violet light 22c is passing through the vacuum chamber 20a, the reactive gaseous component is too little to produce the undesirable reaction product, and the filter plate 21 is never tarnished. After the ultra-violet light 22c is filtered, the exposure light 22d does not produce the reaction product from the reactive gaseous component contained in the air. For this reason, even though the reactive gaseous component exists in the space between the filter 21 and the reticle 27a, the reaction product is hardly produced without the short-wavelength light components, and, accordingly, the reticle 27a is never tarnished. This results in the enhancement of the uniformity of the exposure light, and the reduction projection aligner improves the through-put. The above described method using the herein described reduction projection aligner is summarized in the flow chart of FIG. 4.

Second Embodiment

Figure 3:
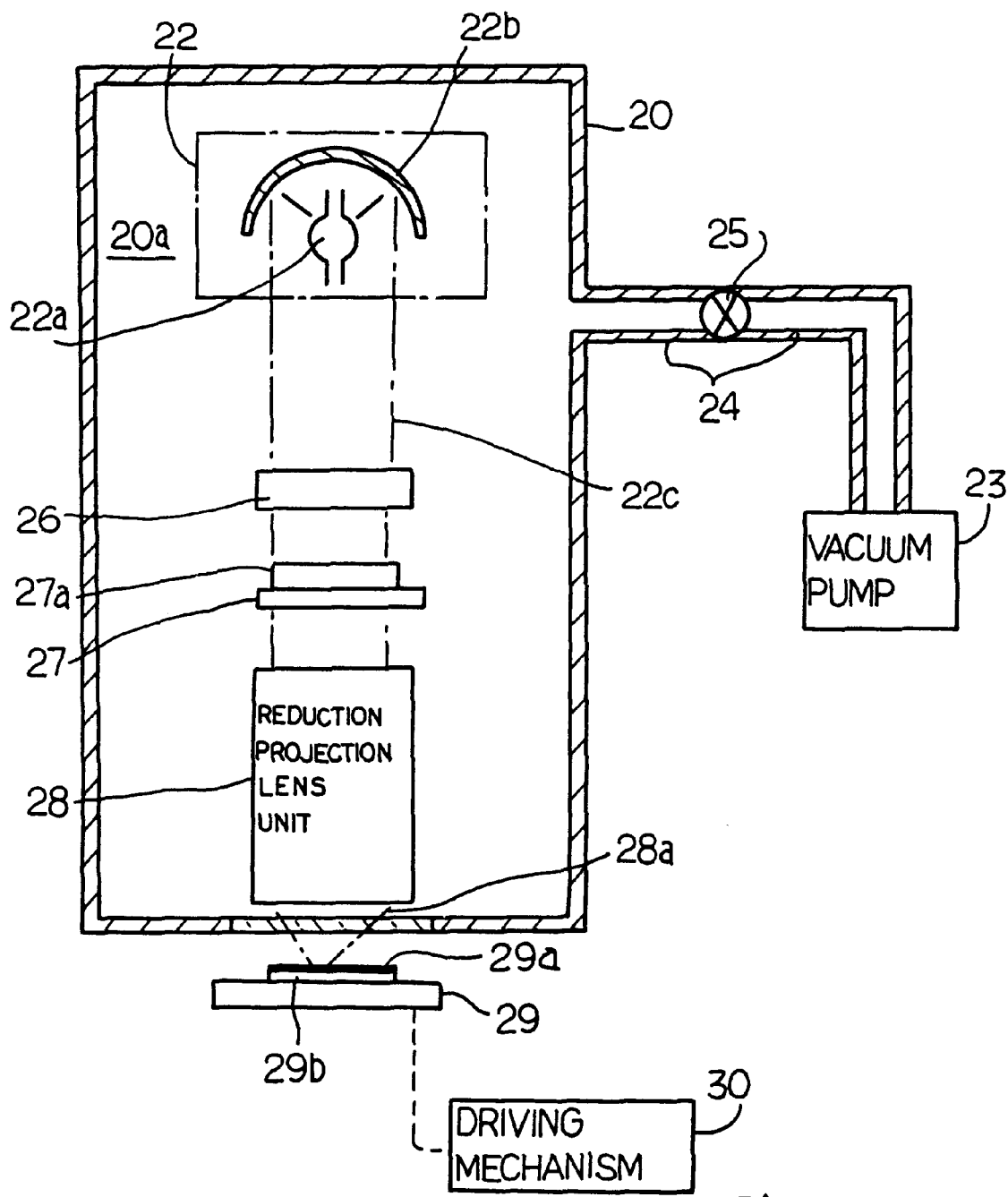
FIG. 3 is a schematic view showing the structure of another reduction projection aligner according to the present invention.

FIG. 3 illustrates another reduction projection aligner embodying the present invention. The reduction projection aligner implementing the second embodiment is similar in component parts to the first embodiment except for the filter plate 21 replaced with an exposure window 40. For this reason, the other components of the second embodiment are labeled with the same references designating corresponding parts of the first embodiment without detailed description.

In the second embodiment, the light source 22, the condenser lens 26, the reticle holder 27 and the reduction projection lens unit 28 are accommodated in the vacuum chamber 20a. Although the light 22c contains the undesirable short-wavelength components, the reactant gaseous component is tight in the vacuum chamber, and the reaction product is hardly produced.

Although a particular embodiment of the present invention has been shown and described, it will be obvious to those skilled in the art that various changes and modifications may be made without departing from the spirit and scope of the present invention.

For example, an optical element such as, for example, a fly-eye lens may be inserted between the light source 22 and the filter plate 21. The reticle holder 27 may be accommodated in the vacuum chamber 20a so as to prevent the reticle from dust particle as similar to the prior art reduction projection aligner.

The present invention is applicable to any kind of aligner, and, for this reason, the reduction projection lens unit is not an indispensable element.

The filter plate may be provided inside of the vessel.

Only the light source and the photo-mask may be accommodated in the vacuum chamber. The other components of the illumination system and the components of the projection optical system may be further accommodated in the vacuum chamber.

What is claimed is:

1. A method for transferring a pattern image from a reticle to a photo-sensitive layer, comprising the steps of:
   a providing said reticle in a optical path from a light source to said photo-sensitive layer, said light source producing light have a light component which reacts with gas to form a reaction product that can accumulate on said reticle,
   b evacuating a gas that reacts with said light component to form a reaction product from a chamber containing said light source whereby accumulation of said reaction product in said chamber is prevented; and
   providing an optical filter in said optical path and at a boundary of said chamber at which light from said light source exits said chamber, said reticle being placed in said optical path and outside said chamber, to thereby eliminate said light component that reacts with said gas before forming an image in said photo-sensitive layer.

2. An optical aligner for transferring a pattern image to a photo-sensitive layer, comprising.
   an illumination system including a light source producing a light, said light containing a first light component available for a pattern transfer and a second light component which reacts with a gas to form a reaction product, wherein said reaction product may accumulate on light transmitting surfaces;
   a reticle having a pattern to be transferred when illuminated with said light;
   a projection optical system provided between said reticle and said photo-sensitive layer for forming a latent image in said photo-sensitive layer,
   a vessel containing at least a part or said illumination system containing said light source;
   an evacuation system for evacuating said gas from said vessel; and
   an optical filter fitted in said vessel for eliminating said second light component from said light radiated toward said reticle.

3. An optical aligner for transferring a pattern image to a photo-sensitive layer, comprising:
   an illumination system including a light source producing a light, said light containing a first light component available for a pattern transfer and a second light component, said second light component having a wavelength no greater than 340 nanometers, which reacts with a gas to form a reaction product comprising at least one of $((NH_4)_2SO_4$ and $SiO_2$, wherein said reaction product may accumulate on light transmitting surfaces;
   a reticle having a pattern to be transferred, and illuminated with said light;
   a projection optical system provided between said reticle and said photo-sensitive layer for forming a latent image in said photo-sensitive layer;
   an optical filter for eliminating said second light component from said light before said light is radiated onto said reticle, and
   a vessel containing at least said light source and said optical filter,
   wherein said vessel is evacuated of said gas by an evacuation system.

4. An optical aligner for transferring a pattern image to a photo-sensitive layer, comprising:
   an illumination system including a light source producing a light, said light containing a first light component and a second light component which reacts with a gas to form a reaction product, wherein said reaction product may accumulate on light transmitting surfaces;
   a reticle having a pattern to be transferred, and illuminated with said light;
   a projection optical system provided between said reticle and said photo-sensitive layer for forming a latent image in said photo-sensitive layer;
   a vessel containing at least said light source, said reticle, said projection optical system, and at least one of an elliptical mirror and a condenser; and
   an evacuation system for evacuating said gas which forms a reaction product when exposed to said second light component from said vessel, wherein said reaction product comprises at least one of $((NH_4)_2SO_4$ and $SiO_2$, and wherein said second light component has wavelengths no greater than 340 nanometers.

5. An optical aligner for transferring a pattern image to a photo-sensitive layer, comprising:

an illumination system including a light source producing a light, said light containing a first light component available for a pattern transfer and a second light component which reacts with a gas to form a reaction product, wherein said reaction product may accumulate on light transmitting surfaces;

a reticle having a pattern to be transferred when illuminated with said light, a projection optical system provided between said reticle and said photo-sensitive layer for forming a latent image in said photo-sensitive layer, a vessel containing at least a part of said illumination system containing said light source;

an evacuation system for evacuating said gas from said vessel, and an optical filter fitted in said vessel for eliminating said second light component from said light radiated toward said reticle.

* * * * *